US011824125B2

(12) United States Patent
Karalkar et al.

(10) Patent No.: US 11,824,125 B2
(45) Date of Patent: Nov. 21, 2023

(54) ELECTROSTATIC DISCHARGE PROTECTION DEVICES FOR BI-DIRECTIONAL CURRENT PROTECTION

(71) Applicant: GLOBALFOUNDRIES Singapore Pte. Ltd., Singapore (SG)

(72) Inventors: Sagar Premnath Karalkar, Essex Junction, VT (US); James Jerry Joseph, Singapore (SG); Jie Zeng, Singapore (SG); Milova Paul, Singapore (SG); Kyong Jin Hwang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 38 days.

(21) Appl. No.: 17/511,569

(22) Filed: Oct. 27, 2021

(65) Prior Publication Data

US 2023/0130632 A1 Apr. 27, 2023

(51) Int. Cl.
*H01L 29/861* (2006.01)
*H01L 29/66* (2006.01)
*H01L 29/06* (2006.01)

(52) U.S. Cl.
CPC ........ *H01L 29/861* (2013.01); *H01L 29/0684* (2013.01); *H01L 29/66121* (2013.01)

(58) Field of Classification Search
CPC ......... H01L 2924/13051; H01L 29/737–7378; H01L 29/66242; H01L 29/66318; H01L 27/067; H01L 27/0722; H01L 27/0783; H01L 29/0808; H01L 29/1008; H01L 29/6625; H01L 29/861; H01L 29/0684; H01L 29/66121; H01L 27/0259; H01L 29/0646–0649
See application file for complete search history.

(56) References Cited

U.S. PATENT DOCUMENTS

| | | | |
|---|---|---|---|
| 7,875,933 B2 | 1/2011 | Schneider et al. | |
| 10,224,411 B2 | 3/2019 | Mallikarjunaswamy et al. | |
| 2013/0049112 A1* | 2/2013 | Lai | H01L 29/0847 257/E29.256 |
| 2016/0351571 A1* | 12/2016 | Chan | H01L 27/027 |
| 2018/0082994 A1 | 3/2018 | Han et al. | |
| 2020/0098741 A1 | 3/2020 | Zeng | |
| 2021/0327869 A1 | 10/2021 | Zeng et al. | |
| 2022/0376119 A1* | 11/2022 | Yoo | H01L 29/0646 |

OTHER PUBLICATIONS

V.A. Vashchenko et al., Multi-Port ESD Protection Using Bi-Directional SCR Structures, 2003 Proceedings of the Bipolar/BiCMOS Circuits and Technology Meeting, 2003, pp. 137-140, IEEE.

* cited by examiner

*Primary Examiner* — Wasiul Haider
(74) *Attorney, Agent, or Firm* — David Cain

(57) ABSTRACT

An electrostatic discharge (ESD) protection device is provided. The ESD protection device includes a substrate, an active region, a first terminal region, and a second terminal region. The substrate includes dopants having a first dopant conductivity. The active region is arranged over the substrate and has an upper surface. The first terminal region and the second terminal region are arranged in the active region laterally spaced apart from each other. The first terminal region and the second terminal region each include a well region having dopants of the first dopant conductivity and a first doped region arranged in the well region. The first doped region includes dopants having a second dopant conductivity.

20 Claims, 5 Drawing Sheets

ELECTROSTATIC DISCHARGE PROTECTION DEVICES FOR BI-DIRECTIONAL CURRENT PROTECTION

TECHNICAL FIELD

The present disclosure relates generally to electrostatic discharge (ESD) protection devices, and more particularly to ESD protection devices for bi-directional current protection and methods of forming the same.

BACKGROUND

Electrostatic discharges (ESD) constitute a permanent threat to electrical systems. An ESD event may involve a power surge, i.e., an excessively high voltage generated during a relatively short period of time. The power surge typically exceeds the breakdown voltage of an electrical system and may lead to an excessively high current through the electrical system, causing irreparable damage.

Protection against such electrostatic discharges or ESD events may be necessary. For example, an electrical system may be coupled to an ESD protection device, and the ESD protection device may be capable of conducting excessively high current away from the electrical system during an ESD event, thereby protecting the electrical system from electrical damage.

In order to effectively protect the electrical system from an ESD event, the ESD protection device is preferably capable of providing bi-directional current protection, i.e., capable of providing protection to positive and negative power surges. However, such an ESD protection device tends to have a large footprint and a high on-resistance. Therefore, solutions are provided to optimize the ESD protection devices.

SUMMARY

To achieve the foregoing and other aspects of the present disclosure, electrostatic discharge (ESD) protection devices for bi-directional current protection and methods of forming the same are presented.

According to an aspect of the present disclosure, an ESD protection device is provided. The ESD protection device includes a substrate, an active region, a first terminal region, and a second terminal region. The substrate includes dopants having a first dopant conductivity. The active region is arranged over the substrate and has an upper surface. The first terminal region and the second terminal region are arranged in the active region laterally spaced apart from each other. The first terminal region and the second terminal region each include a well region having dopants of the first dopant conductivity and a first doped region arranged in the well region. The first doped region includes dopants having a second dopant conductivity.

According to another aspect of the present disclosure, an ESD protection device is provided. The ESD protection device includes a substrate, an active region, a deep well region, an insulating layer, a first terminal region, and a second terminal region. The substrate includes dopants having a first dopant conductivity. The active region is arranged over the substrate. The deep well region is arranged in the active region and includes dopants having a second dopant conductivity. The insulating layer is arranged over the deep well region. The first terminal region and the second terminal region are arranged in the deep well region laterally spaced apart from each other. The first terminal region and the second terminal region each include a well region having dopants of the first dopant conductivity and a first doped region arranged in the well region. The first doped region includes dopants having the second dopant conductivity.

According to yet another aspect of the present disclosure, a method of forming an ESD protection device is provided. The method includes forming an active region having an upper surface in a substrate and forming a pair of well regions in the active region. The substrate and the pair of well regions include dopants having a first dopant conductivity. A first doped region is formed in each well region of the pair of well regions. The first doped region in each well region of the pair of well regions has a second dopant conductivity. One well region of the pair of well regions and the respective first doped region in the well region form a first terminal region and the other well region of the pair of well regions and the respective first doped region in the well region form a second terminal region.

BRIEF DESCRIPTION OF THE DRAWINGS

The embodiments of the present disclosure will be better understood from a reading of the following detailed description, taken in conjunction with the accompanying drawings.

Figure 1:
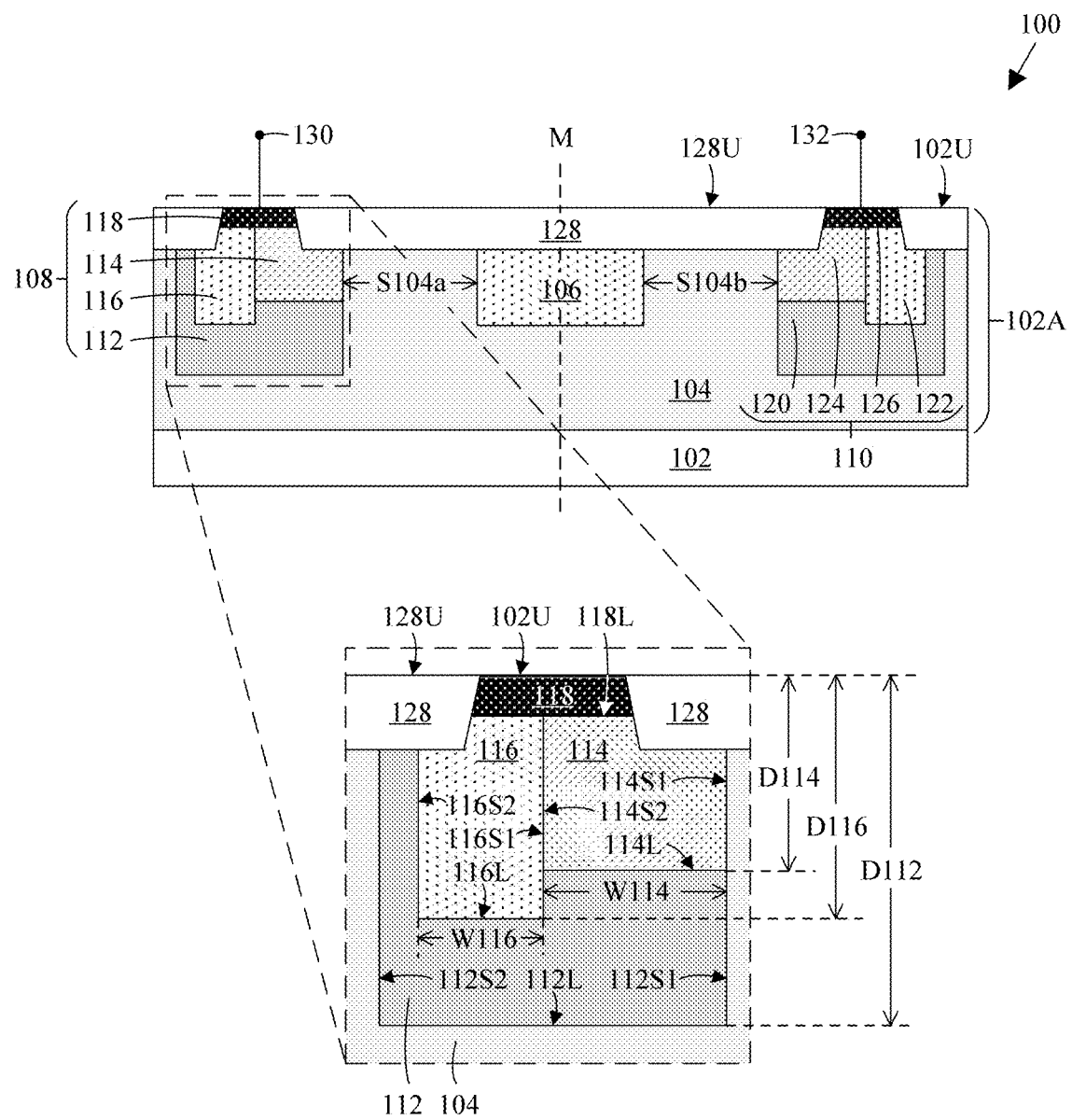
FIG. 1 is a cross-sectional view of an ESD protection device, according to an embodiment of the disclosure.

For simplicity and clarity of illustration, the drawings illustrate the general manner of construction, and certain descriptions and details of features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to electrostatic discharge (ESD) protection devices for providing bi-directional current protection and methods of forming the same are presented. An ESD protection device may be coupled to an electrical system to conduct excessively high current arising from an ESD event to, for example, the ground, thereby preserving the functionality of the electrical system.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1 is a cross-sectional view of an ESD protection device 100, according to an embodiment of the disclosure. The ESD protection device 100 may be suitable for providing bi-directional current protection to an electrical system. The ESD protection device 100 may include a lateral hetero junction transistor (HBT) having a symmetrical reverse breakdown voltage for positive and negative voltages. Hereinafter, the ESD protection device 100 will be described with reference to a PNP-type HBT. Alternatively, an NPN-type HBT may be applicable as an ESD protection device by reversing polarities of dopant conductivities as disclosed herein.

The ESD protection device 100 may be arranged over a substrate 102. The substrate 102 may include a semiconductor material, such as silicon, silicon germanium, silicon carbide, other II-VI or III-V semiconductor compounds, and the like. The substrate may be a bulk semiconductor substrate or a composite semiconductor substrate, such as a semiconductor-on-insulator (SOI) substrate. The substrate 102 may further include dopants. In an embodiment of the disclosure, the substrate 102 may include P-type conductivity dopants, such as, but are not limited to, boron, aluminum, gallium, or combinations thereof.

Furthermore, an active region 102A may be arranged over the substrate 102 and the ESD protection device 100 may be arranged in the active region 102A. The active region 102A may be electrically isolated from adjacent conductive features (not shown) by an isolation feature (not shown). The active region 102A may include an upper surface 102U.

The active region 102A may include a plurality of doped regions, for example, a deep well region 104, a well region 106, a first terminal region 108, and a second terminal region 110. The well region 106, the first terminal region 108, and the second terminal region 110 may be arranged in the deep well region 104.

The deep well region 104 may be referred to as a high voltage deep well region. The deep well region 104 may include dopants having N-type conductivity, such as, but are not limited to, arsenic, phosphorus, antimony, or combinations thereof. In an embodiment of the disclosure, the deep well region 104 may have a dopant concentration higher than that of the substrate 102. In another embodiment of the disclosure, the deep well region 104 may have a dopant concentration of about 5E15 cm-3 to about 5E16 cm-3.

The well region 106 may be arranged within the deep well region 104 and between the first terminal region 108 and the second terminal region 110. The well region 106 may include dopants having the same dopant conductivity as the deep well region 104, for example, N-type conductivity dopants. However, the well region 106 may or may not include the same dopants as the deep well region 104. The well region 106 may serve to increase the reliability of the ESD protection device 100 by minimizing early punch-through and current leakage through the ESD protection device 100. In an embodiment of the disclosure, the well region 106 may have a higher dopant concentration than the deep well region 104. In another embodiment of the disclosure, the well region 106 may include a dopant concentration of about 1E17 cm-3 to about 5E18 cm-3.

The first terminal region 108 may include a plurality of doped regions, for example, a high voltage well region 112, a drift region 114, a doped region 116, and a contact region 118. The high voltage well region 112 may be arranged within the deep well region 104 and may include dopants having a different dopant conductivity from the deep well region 104, for example, P-type dopant conductivity. The high voltage well region 112 may have a higher dopant concentration than the deep well region 104. In an embodiment of the disclosure, the high voltage well region 112 may include a dopant concentration of about 1E16 cm-3 to about 1E17 cm-3.

The high voltage well region 112 may include a lower surface 112L, a side surface 112S1, and a side surface 112S2 laterally opposite the side surface 112S1. The high voltage well region 112 may further have a depth D112 from the upper surface 102U of the active region 102A to the lower surface 112L of the high voltage well region 112. As used herein, the term "lateral" refers to a direction substantially parallel to a plane of the upper surface 102U of the active region 102A. The term "vertical" refers to a direction substantially perpendicular to the plane of the upper surface 102U of the active region 102A.

In an embodiment of the disclosure, the high voltage well region 112 may provide a deeper junction depth than the other doped regions in the first terminal region 108 for a more effective current conduction through the ESD protection device 100.

The drift region 114 may be arranged in the high voltage well region 112 and may include dopants having the same dopant conductivity as the high voltage well region 112, for example, P-type dopant conductivity. The drift region 114 may have a higher dopant concentration than the high voltage well region 112. However, the drift region 114 may or may not include the same dopants as the high voltage well region 112. In an embodiment of the disclosure, the drift region 114 may include a dopant concentration of about 5E16 cm-3 to about 5E17 cm-3.

The drift region 114 may include a lower surface 114L, a side surface 114S1, and a side surface 114S2 laterally opposite the side surface 114S1. The drift region 114 may provide a shallower junction depth than the high voltage well region 112. For example, the drift region 114 may have a depth D114 from the upper surface 102U of the active region 102A to the lower surface 114L of the drift region 114. In an embodiment of the disclosure, the depth D114 may have a range of about 1000 nm to about 2000 nm. Additionally, the drift region 114 may be fully arranged in the high voltage well region 112, and the side surface 114S1 of the drift region 114 may be substantially vertically aligned with the side surface 112S1 of the high voltage well region 112, i.e., the side surface 114S1 of the drift region 114 may be substantially coplanar with the side surface 112S1 of the high voltage well region 112.

The doped region 116 may be arranged in the high voltage well region 112 and may include dopants having a different dopant conductivity as the high voltage well region 112, for example, N-type dopant conductivity. The doped region 116 may have the same dopant conductivity as the deep well region 104 and the well region 106, however, the doped region 116 may or may not include the same dopants as the deep well region 104 and the well region 106. The doped region 116 may have a higher dopant concentration than the drift region 114. In an embodiment of the disclosure, the doped region 116 may include a dopant concentration of about 1E17 cm-3 to about 5E18 cm-3.

The doped region 116 may be arranged laterally adjacent to and contact the drift region 114. For example, the doped region 116 may include a side surface 116S1 and a side surface 116S2 laterally opposite the side surface 116S1, and the side surface 116S1 may share a common plane with the side surface 114S2 of the drift region 114. Additionally, the doped region 116 may be spaced apart from the deep well region 104 by a portion of the high voltage well region 112 such that the side surface 116S2 of doped region 116 and the side surface 112S2 of the high voltage well region 112 do not share a common vertical plane in the deep well region 104.

The doped region 116 may further include a lower surface 116L, and the doped region 116 may have a depth D116 from the upper surface 102U of the active region 102A to the lower surface 116L. The depth D116 may be deeper than the depth D114 of the drift region 114 such that the lower surface 116L of the doped region 116 may be arranged under and spaced apart from the lower surface 114L of the drift region 114. In an embodiment of the disclosure, the depth D116 may have a range of about 1500 nm to about 2500 nm. Additionally, the depth D116 may be shallower than the depth D112 of the high voltage well region 112 such that the lower surface 116L of the doped region 116 may be arranged over and spaced apart from the lower surface 112L of the high voltage well region 112.

In an embodiment of the disclosure, the doped region 116 may have a width W116 and the drift region 114 may have a width W114, and the width W116 may be narrower than the width W114. As used herein, the term "width" refers to a measurement of a feature from two laterally opposing side surfaces, for example, from the side surface 116S1 to the side surface 116S2 of the doped region 116 or from the side surface 114S1 to the side surface 114S2 of the drift region 114. The narrower width W116 of the doped region 116 may serve to provide a more effective current conduction through the first terminal region 108. In another embodiment of the disclosure, the width W116 of the doped region 116 may be at least half the width W114 of the drift region 114. In yet another embodiment of the disclosure, the width W114 of the drift region 114 may be at most about 4000 nm and the width W116 of the doped region 116 may be at least 1000 nm.

The contact region 118 may be arranged in the high voltage well region 112 and may be at least partially arranged over the drift region 114. For example, a portion of the contact region 118 may be arranged over the drift region 114, and another portion of the contact region 118 may be arranged over the doped region 116, as illustrated in FIG. 1. In another example, the contact region 118 may include a lower surface 118L, and the side surface 116S1 of the doped region 116 may be arranged under the lower surface 118L of the contact region 118. The contact region 118 may serve as a contact region of the ESD protection device 100, such that the ESD protection device 100 may be at least electrically coupled to an electrical system through the contact region 118. According to another embodiment of the disclosure, the contact region 118 may be arranged entirely over the drift region 114, even though this embodiment is not illustrated in the accompanying drawings.

The contact region 118 may include dopants having the same dopant conductivity as the high voltage well region 112 and the drift region 114, for example, P-type dopant conductivity. However, the contact region 118 may or may not include the same dopants as the high voltage well region 112 or the drift region 114. The contact region 118 may have a higher dopant concentration than the drift region 114. In an embodiment of the disclosure, the contact region 118 may include a dopant concentration of about 1E19 cm-3 to about 5E20 cm-3.

The second terminal region 110 may be a mirror image of the first terminal region 108, i.e. the second terminal region 110 may have mirror symmetry of the first terminal region 108 about an axis M through the center of the ESD protection device 100. For example, the second terminal region 110 may include a high voltage well region 120, a drift region 122, a doped region 124, and a contact region 126. The high voltage well region 120 may be synonymous with the high voltage well region 112, the drift region 122 may be synonymous with the drift region 114, the doped region 124 may be synonymous with the doped region 116, and the contact region 126 may be synonymous with the contact region 118. The high voltage well region 120, the drift region 122, the doped region 124, and the contact region 126 may be arranged in a similar arrangement configuration as the high voltage well region 112, the drift region 114, the doped region 116, and the contact region 118 of the first terminal region 108.

The first terminal region 108 and the second terminal region 110 may be arranged at proximate ends of the deep well region 104 and the well region 106 may be arranged between the first terminal region 108 and the second terminal region 110. The first terminal region 108 may be spaced apart from the well region 106 by a portion of the deep well region 104 having a lateral spacing S104a. Similarly, the second terminal region 110 may be spaced apart from the well region 106 by another portion of the deep well region 104 having a lateral spacing S104b. As illustrated in FIG. 1, the lateral spacing S104a may be substantially equal to the lateral spacing S104b. However, the lateral spacing S104a and the lateral spacing S104b may be different, according to another embodiment of the disclosure. In an embodiment of the disclosure, each lateral spacing S104a, S104b may range from about 1000 nm to about 5000 nm.

As the first terminal region 108 and the second terminal region 110 may include predominantly higher concentrations of P-type conductivity dopants, the first terminal region 108 and the second terminal region 110 may be referred to as P-type terminal regions. Therefore, the first terminal region 108 and the second terminal region 110 may have a different dopant conductivity than the deep well region 104 and the deep well region 104 may serve to electrically isolate the first terminal region 108 and the second terminal region 110 from the substrate 102.

The ESD protection device 100 may further include an insulating layer 128. The insulating layer 128 may be arranged partially over the deep well region 104. For example, the insulating layer 128 may be arranged at laterally opposing sides of the contact region 118 of the first terminal region 108 and the contact region 126 of the second terminal region 110. A portion of the insulating layer 128 may extend continuously between the contact region 118 of the first terminal region 108 to the contact region 126 of the second terminal region 110 and entirely overlays the well region 106.

Additionally, the insulating layer 128 may be at least partially arranged in the active region 102A. For example, the insulating layer 128 may have an upper surface 128U and the insulating layer 128 may be arranged completely within the active region 102A such that the upper surface 128U may be substantially coplanar with the upper surface 102U of the active region 102A, as illustrated in FIG. 1. In another example, the upper surface 128U of the insulating layer 128 may be over the upper surface 102U of the active region 102A, even though this embodiment is not shown in the FIG. 1. The insulating layer 128 may extend from the upper surface 102U of the active region 102A and terminate therewithin. In an embodiment of the disclosure, the insulating layer 128 may be a dielectric isolation layer, such as a shallow trench isolation (STI) layer. In another embodiment of the disclosure, the insulating layer may include a dielectric material such as, but is not limited to, silicon dioxide.

The first terminal region 108 and the second terminal region 110 may be electrically coupled to a first terminal point 130 and a second terminal point 132, respectively, through their respective contact regions 118 and 126. The first terminal point 130 and the second terminal point 132 may be electrically coupled to respective connectors (not shown) of an electrical system (not shown), so that during an ESD event, the excessive current generated may be shunted through the ESD protection device 100 instead of flowing to the electrical system.

The ESD protection device 100 may provide a lower on-resistance with the inclusion of the doped region 116 in the first terminal region 108 and the doped region 124 in the second terminal region 110. When an ESD event occurs, the voltage across the ESD protection device 100 will exceed the triggering voltage of the ESD protection device 100 and the current will flow through the ESD protection device 100 to conduct excess current away from the external system. For example, during the ESD event, the doped region 116 and the doped region 124 in the first terminal region 108 and the second terminal region 110, respectively, will form an NPN junction to enhance current conduction using electrons as charge carriers, thereby lowering the on-resistance of the ESD protection device 100.

Figure 2:
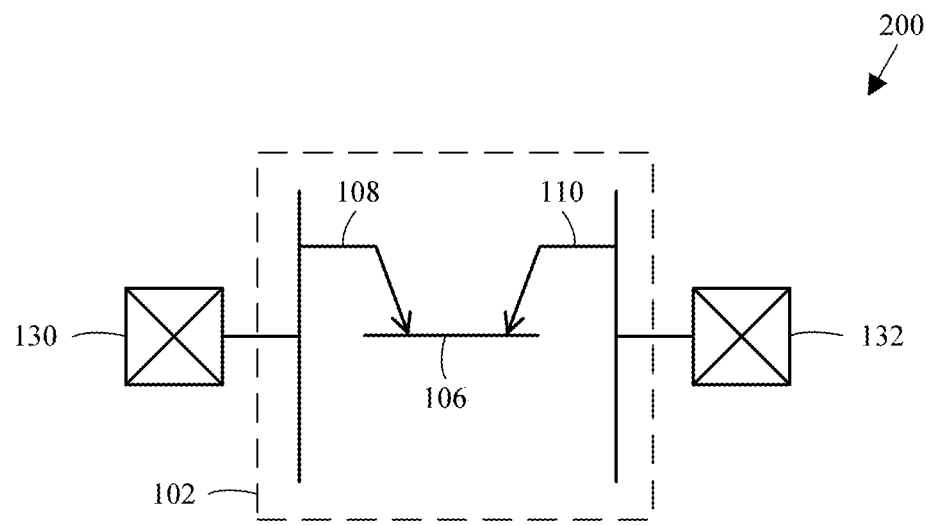
FIG. 2 is a circuit diagram of the ESD protection device of FIG. 1, according to an embodiment of the disclosure.

FIG. 2 illustrates an equivalent circuit diagram 200 of the ESD protection device 100, according to an embodiment of the disclosure. The ESD protection device 100 may operate as a transistor device. For example, each terminal point 130, 132 may serve as an emitter region or a collector region of the transistor device, depending on the voltage levels received at the first terminal region 108 and the second terminal region 110. Where the first terminal region 108 is biased at a higher voltage than the second terminal region 110, the first terminal region 108 may serve as a collector region while the second terminal region 110 may serve as an emitter region. Alternatively, where the first terminal region 108 is biased at a lower voltage than the second terminal region 110, the first terminal region 108 may serve as an emitter region while the second terminal region 110 may serve as a collector region.

Figure 3:
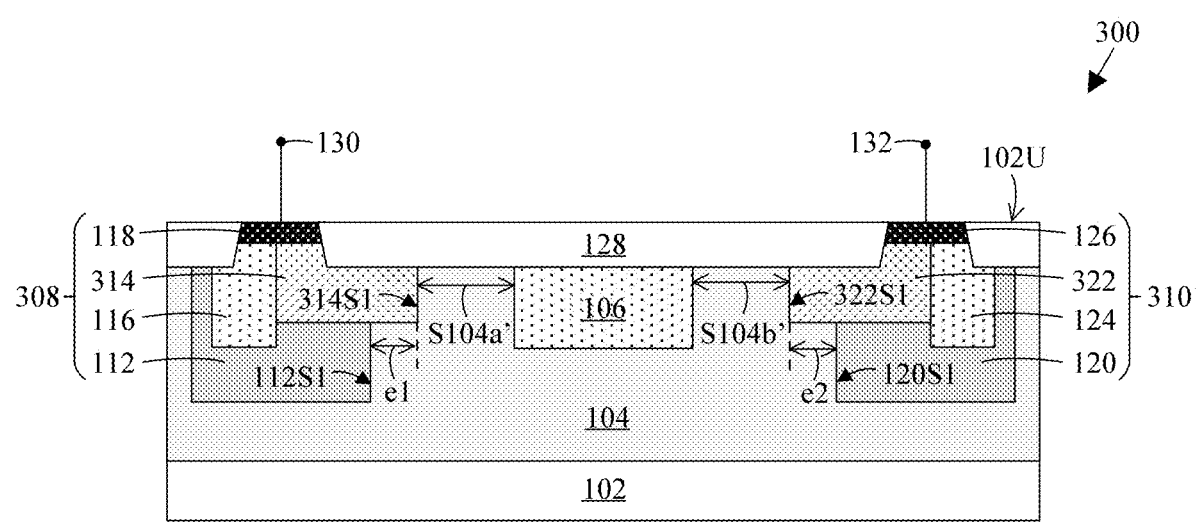
FIG. 3 is a cross-sectional view of an ESD protection device, according to another embodiment of the disclosure.

FIG. 3 is a cross-sectional view of an ESD protection device 300, according to an embodiment of the disclosure. The ESD protection device 300 may be similar to the ESD protection device 100 in FIG. 1, and thus common features are labeled with the same reference numerals and need not be discussed.

Similar to the ESD protection device 100, the ESD protection device 300 may also include a first terminal region 308 and a second terminal region 310. The first terminal region 308 may include a high voltage well region 112 and a doped region 314 and the second terminal region 310 may include a high voltage well region 120 and a doped region 322. The doped regions 314 and 322 may be synonymous with the drift regions 114 and 122, respectively, of the ESD protection device 100 in FIG. 1A.

However, unlike the drift regions 114 and 122 of the ESD protection device 100, the doped regions 314 and 322 may be at least partially arranged within the high voltage well regions 112 and 120, respectively. For example, referring to the first terminal region 108, the doped region 314 may extend beyond the high voltage well region 112 into the deep well region 104 by an extension e1, and the side surface 314S1 of the doped region 314 may not be vertically aligned with the side surface 112S1 of the high voltage well region 112. Similarly, the doped region 322 of the second terminal region 110 may extend beyond the high voltage well region 120 into the deep well region 104 by an extension e2 and the side surface 322S1 of the doped region 322 may not be vertically aligned with the side surface 120S1 of the high voltage well region 120.

Accordingly, the first terminal region 108 may be spaced apart from the well region 106 by a portion of the deep well region 104 having a lateral spacing S104a' and the second terminal region 110 may be spaced apart from the well region 106 by a portion of the deep well region 104 having a lateral spacing S104b'; the lateral spacings S104a' and S104b' may be narrower than the lateral spacings S104a and S104b in the ESD protection device 100 of FIG. 1. In an embodiment of the disclosure, each lateral spacing S104a', S104b' may have a range of about 500 nm to about 4000 nm.

Figure 4:
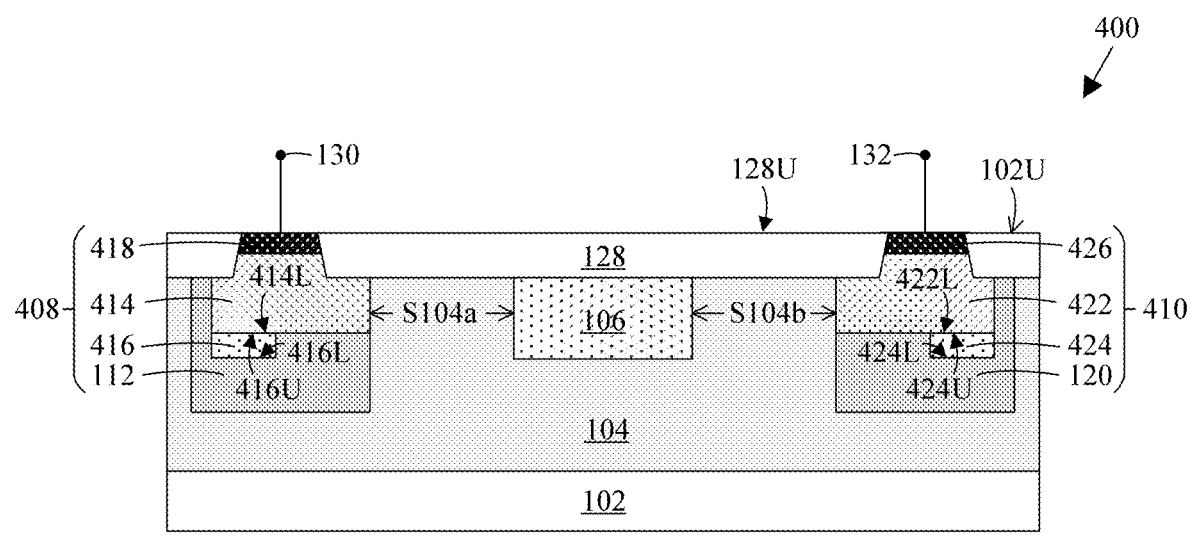
FIG. 4 is a cross-sectional view of an ESD protection device, according to yet another embodiment of the disclosure.

FIG. 4 is a cross-sectional view of an ESD protection device 400, according to an embodiment of the disclosure. The ESD protection device 400 may be similar to the ESD protection device 100 in FIG. 1, and thus common features are labeled with the same reference numerals and need not be discussed.

Similar to the ESD protection device 100, the ESD protection device 400 may also include a first terminal region 408 and a second terminal region 410. The first terminal region 408 may include a drift region 414, a doped region 416, and a contact region 418. The drift region 414, the doped region 416, and the contact region 418 may be synonymous with the drift region 114, the doped region 116, and the contact region 118, respectively, of the first terminal region 108 of the ESD protection device 100 in FIG. 1. The doped region 416 may include a lower surface 416L arranged under the lower surface 414L of the drift region 414. The second terminal region 410 may include a drift region 422, a doped region 424, and a contact region 426. The drift region 422, the doped region 424, and the contact region 426 may be synonymous with the drift region 122, the doped region 124, and the contact region 126, respectively, of the second terminal region 110 of the ESD protection device 100 in FIG. 1. The doped region 424 may include a lower surface 424L arranged under the lower surface 422L of the drift region 422.

However, unlike the arrangement configuration of the ESD protection device 100, the drift regions 414 and 422, the doped regions 416 and 424, and the contact regions 418 and 426 may include a different arrangement configuration. Referring to the first terminal region 408, the doped region 416 may be arranged under and contact the drift region 414. For example, the doped region 416 may include an upper surface 416U arranged against the lower surface 414L of the drift region 414, i.e., the upper surface 416U and the upper surface 416U may share a common plane with the lower surface 414L within the high voltage well region 112.

Similarly, referring to the second terminal region 410, the doped region 424 may be arranged under and contact the drift region 422. For example, the doped region 424 may include an upper surface 424U arranged against the lower surface 422L of the drift region 422, i.e., the upper surface 424U and the lower surface 422L may share a common horizontal plane within the high voltage well region 120.

In an embodiment of the disclosure, the drift regions 414 and 422 may each have a depth from the upper surface 102U of the active region 102A to the lower surfaces 414L and 422L, respectively, and the depth may have a range of about 1000 nm to about 2000 nm. In another embodiment of the disclosure, the doped regions 416 and 424 may each have a depth from the upper surface 102U of the active region 102A to the lower surfaces 416L and 424L, respectively, and the second may have a range of about 1500 nm to about 2500 nm.

Additionally, the contact region 418 in the first terminal region 408 and the contact region 426 in the second terminal region 410 may be arranged over the entire drift regions 414 and 422, respectively.

Figure 5:
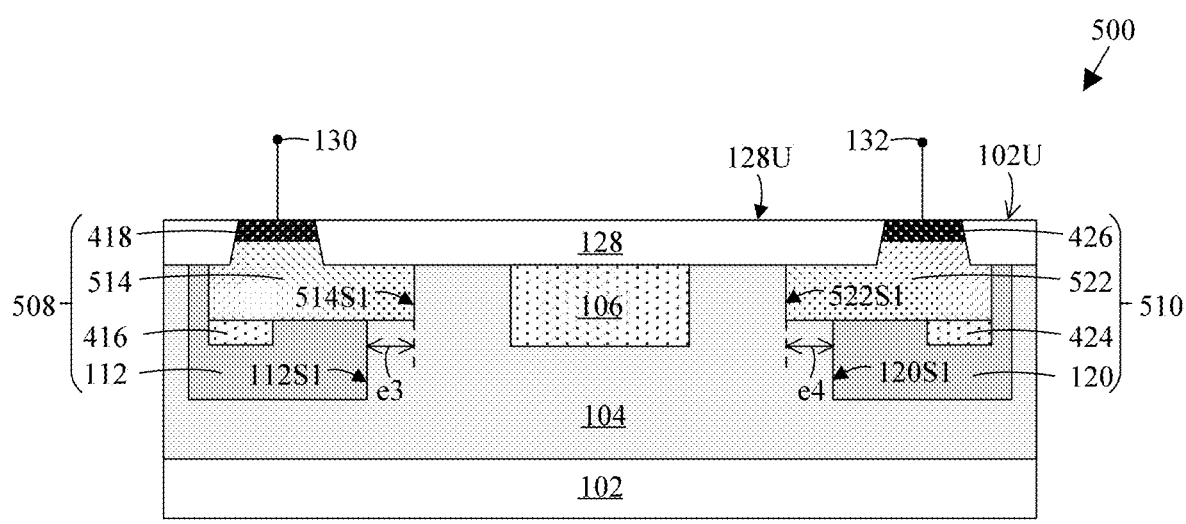
FIG. 5 is a cross-sectional view of an ESD protection device, according to a further embodiment of the disclosure.

FIG. 5 is a cross-sectional view of an ESD protection device 500, according to an embodiment of the disclosure. The ESD protection device 500 may be similar to the ESD protection device 400 in FIG. 4, and thus common features are labeled with the same reference numerals and need not be discussed.

Similar to the ESD protection device 400, the ESD protection device 500 may also include a first terminal region 508 and a second terminal region 510. The ESD protection device 500 may include a high voltage well region 112 and a drift region 514 in the first terminal region 508, and a high voltage well region 120 and a drift region 522 in the second terminal region 510. The drift regions 514 and 522 may be synonymous with the drift regions 414 and 422, respectively, of the ESD protection device 400 in FIG. 4.

However, unlike the drift regions 414 and 422 of the ESD protection device 400, the drift regions 514 and 522 may be at least partially arranged within the high voltage well regions 112 and 120, respectively. For example, referring to the first terminal region 508, the drift region 514 may include a side surface 514S1 may extend beyond the high voltage well region 112 by an extension e3 and the side surface 514S1 of the drift region 514 may not be vertically aligned with the side surface 112S1 of the high voltage well region 112. Similarly, the drift region 522 of the second terminal region 510 may extend beyond the high voltage well region 120 by an extension e4 and the side surface 522S1 of the drift region 522 may not be vertically aligned with the side surface 120S1 of the high voltage well region 120.

Figure 6:
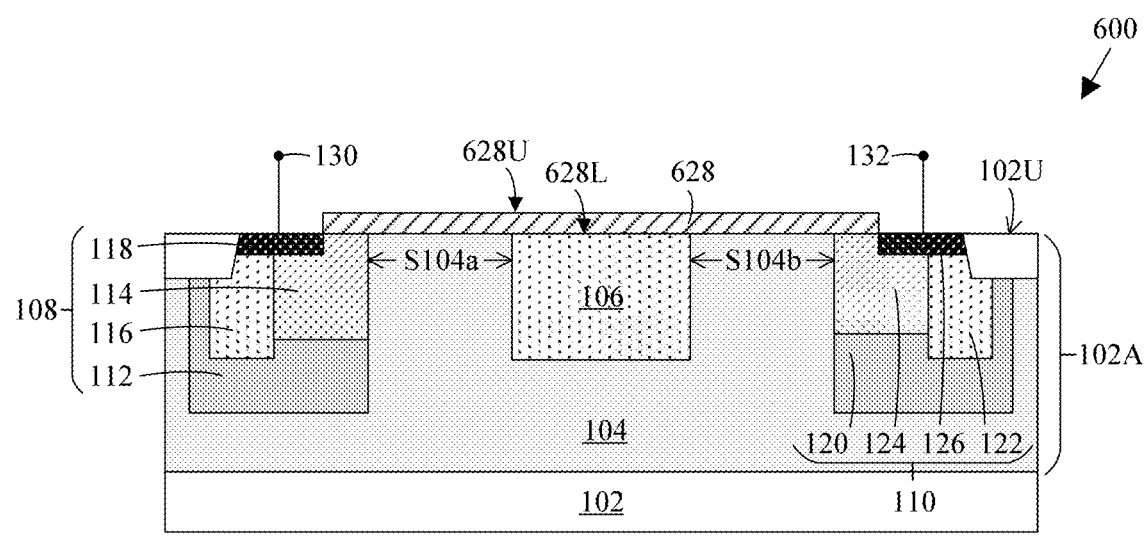
FIG. 6 is a cross-sectional view of an ESD protection device, according to a yet further embodiment of the disclosure.

FIG. 6 is cross-sectional views of an ESD protection device 600, according to an embodiment of the disclosure. The ESD protection device 600 may be similar to the ESD protection device 100 in FIG. 1, and thus common features are labeled with the same reference numerals and need not be discussed.

Similar to the ESD protection device 100, the ESD protection device 600 may include an insulating layer 628. The insulating layer 628 may be synonymous with the insulating layer 128 of the ESD protection device 100 in FIG. 1.

However, unlike the insulating layer 128 of the ESD protection device 100, the insulating layer 628 may be arranged over the active region 102A. For example, the insulating layer 628 may have a lower surface 628L arranged against the upper surface 102U of the active region 102A, i.e., the lower surface 628L of the insulating layer 628 and the upper surface 102U of the active region 102A may share a common plane. In another example, the insulating layer 628 may have an upper surface 628U arranged over the upper surface 102U of the active region 102A. In an embodiment of the disclosure, the insulating layer 628 may be a dielectric isolation layer, such as a silicide alignment block (SAB) layer. In another embodiment of the disclosure, the insulating layer 628 may include a dielectric material such as, but is not limited to, silicon nitride.

There are several advantages to using either an STI layer or a SAB layer as the insulating layer for an ESD protection device. For example, an STI layer may be preferred for a relatively high voltage application as the STI layer may provide a higher device breakdown voltage while compromising on the current dopant conductivity as compared to a SAB layer. In another example, a SAB layer may be preferred for a relatively lower voltage application as the SAB layer may provide a relatively higher current dopant conductivity while providing a lower device breakdown voltage than an STI layer. Thus, there may be a tradeoff between the device breakdown voltage and the current dopant conductivity.

Figure 7:
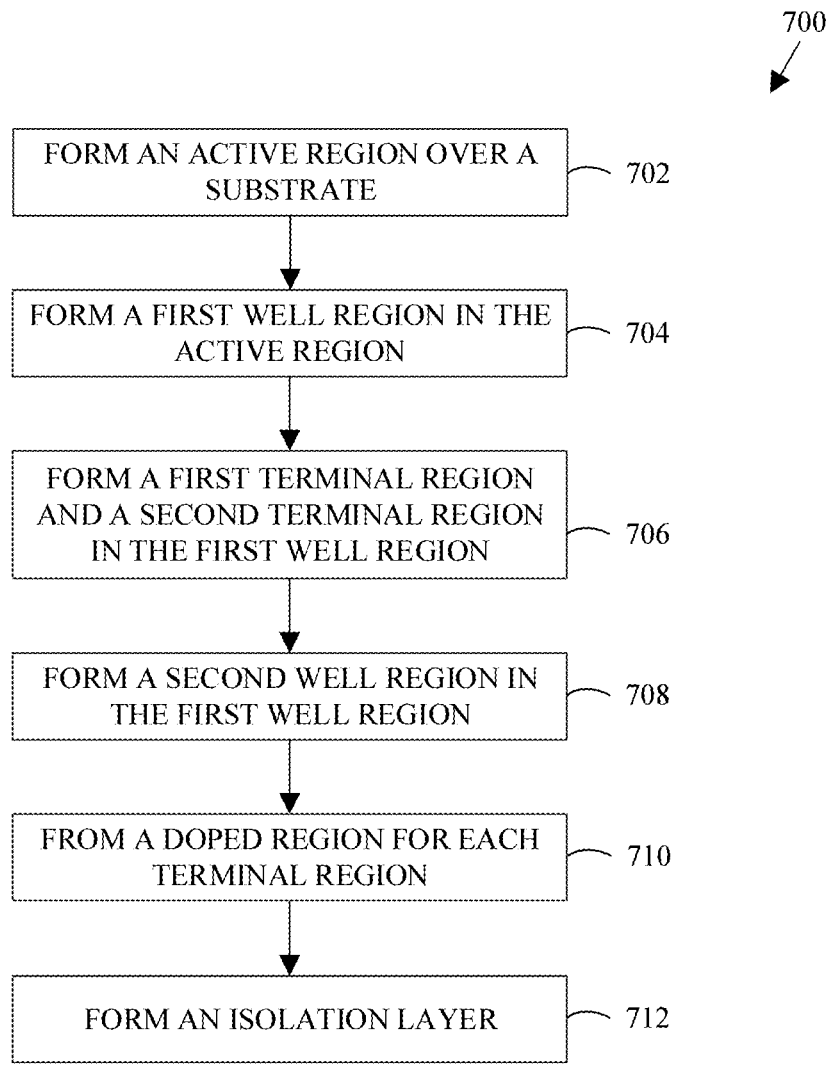
FIG. 7 is a flow chart illustrating a method of forming the ESD protection device of FIG. 1, according to an embodiment of the disclosure.

FIG. 7 is a flow chart 700 illustrating a method of forming an ESD protection device, according to an embodiment of the disclosure. The ESD protection device may be similar to the ESD protection device 100 of FIG. 1. Certain structures may be fabricated, for example, using known processes and techniques, and specifically disclosed processes and methods may be used to achieve individual aspects of the present disclosure. The below-described order for the method of forming the ESD protection device is intended to be illustrative, and the method is not limited to the above specifically described order unless otherwise specifically stated.

As used herein, "deposition techniques" refer to the process of applying a material over another material. Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" include deposition of material or photoresist, patterning, exposure, development, etching, cleaning, and/or removal of the material or photoresist as required in forming a described pattern, structure, or opening. Exemplary examples of techniques for patterning include, but not limited to, wet etch photolithographic processes, dry etch photolithographic processes, or direct patterning processes.

A substrate may be provided. The substrate may be synonymous with the substrate 102 of the ESD protection device 100 of FIG. 1. An active region may be formed over the substrate, as illustrated by operation 702 in the flow chart 700. The active region may be synonymous with the active region 102A of the ESD protection device 100 in FIG. 1. The active region may be electrically isolated from adjacent conductive features by an isolation feature (not shown in the accompanying drawings)

A first well region may be formed in the active region, as illustrated by operation 704. The first well region may be synonymous with the deep well region 104 of the ESD protection device 100 of FIG. 1. The first well region may be formed by introducing dopants into the active region using a doping technique, such as an ion implantation process. Alternatively, the first well region may be formed by growing an epitaxial layer in the active region and introducing the dopants into the epitaxial layer using an in-situ doping technique. In an embodiment of the disclosure, the first well region may include dopants having a different dopant conductivity from the active region, for example, N-type conductivity dopants. The first well region may also have a higher dopant concentration than the active region.

A first terminal region and a second terminal region may be formed in the first well region, as illustrated by operation 706. The first terminal region and the second terminal region may be synonymous with the first terminal region 108 and the second terminal region 110 of FIG. 1, respectively. The first terminal region and the second terminal region may be spaced apart from each other and may have mirror symmetry about a center of the ESD protection device, for example, about an axis M as illustrated in FIG. 1.

An exemplary method of forming the first terminal region is described herein. A first doped region may be formed in the first well region. The first doped region may be synonymous with the high voltage well region 112 of the ESD protection device 100 of FIG. 1. The first doped region may be formed by introducing dopants into the first well region using a doping technique, such as an ion implantation process. In an embodiment of the disclosure, the first doped region may include dopants having a different dopant conductivity than the first well region, for example, P-type conductivity dopants. The first doped region may also have a higher dopant concentration than the first well region.

A second doped region may be formed in the first doped region. The second doped region may be synonymous with the drift region 114 of the ESD protection device 100 of FIG. 1. The second doped region may be formed by introducing dopants into the first doped region using a doping technique, such as an ion implantation process. In an embodiment of the disclosure, the second doped region may include dopants having the same dopant conductivity as the first doped region; the dopants in the second doped region may or may not include the same dopants as the first doped region. The second doped region may also have a higher dopant concentration than the first well region.

A third doped region may be formed in the first doped region and adjacent to the second doped region. The third doped region may be synonymous with the doped region 116 of the ESD protection device 100 of FIG. 1. The third doped region may be formed by introducing dopants into the first doped region using a doping technique, such as an ion implantation process. The ion implantation process may include counter doping the first well region with dopants having a different dopant conductivity. In an embodiment of the disclosure, the third doped region may include dopants having a different dopant conductivity from the first doped region and the second doped region, for example, N-type conductivity dopants. The dopants in the third doped region may or may not include the same dopants as the first well region. The third doped region may also have a higher dopant concentration than the first well region.

A similar process may be employed to form the second terminal region. The second terminal region may be formed concurrently with the first terminal region, according to an embodiment of the disclosure. In another embodiment of the disclosure, the second terminal region may be formed separately from the first terminal region.

A second well region may be formed in the first well region and between the first terminal region and the second terminal region, as illustrated by operation 708. The second well region may be synonymous with the well region 106 of the ESD protection device 100 of FIG. 1. The second well region may be formed by introducing dopants into the first well region using a doping technique, such as an ion implantation process. In an embodiment of the disclosure, the second well region may include dopants having the same dopant conductivity as the first well region; the dopants in the second well region may or may not include the same dopants as the first well region. The second well region may also have a higher dopant concentration than the first well region.

A fourth doped region may be formed for each terminal region, as illustrated by operation 710. The fourth doped region may be synonymous with the contact region 118 of the first terminal region 108 and the contact region 126 of the second terminal region 110 of the ESD protection device 100 of FIG. 1. The fourth doped region in each terminal region may be formed by introducing dopants into the respective first and second doped regions using a doping technique, such as an ion implantation process. In an embodiment of the disclosure, the fourth doped region in each terminal region may include dopants having the same dopant conductivity as the first doped region and the second doped region of each terminal region; the dopants in the fourth doped region may or may not include the same dopants as the first doped region and the second doped region.

An insulating layer may be formed at least partially over the first well region, as illustrated by operation 712. In an embodiment of the disclosure, the insulating layer may be synonymous with the insulating layer 128 of the ESD protection device 100 of FIG. 1. An exemplary method of forming the insulating layer may be described herein. A trench may be formed in the active region using a patterning technique. For example, the trench may be formed at laterally opposing sides of the fourth doped region of the first terminal region and the fourth doped region of the second terminal region. A dielectric material may be deposited in the trench using a deposition technique.

In another embodiment of the disclosure, the insulating layer may be synonymous with the insulating layer 628 of the ESD protection device 600 of FIG. 6. An exemplary method of forming the insulating layer may be described herein. A layer of dielectric material may be deposited over the first well region using a deposition technique and the layer of dielectric material may be patterned using a patterning technique to form openings such that the fourth doped region of each terminal region may be exposed therein.

Electrical connections may be formed at the fourth doped region of each terminal region to electrically couple the ESD protection device to a first terminal point and a second terminal point. The first terminal point and the second terminal point may be electrically coupled to respective connectors of an electrical system to protect the electrical system from damage arising by an ESD event.

As presented in the above disclosure, various embodiments of ESD protection devices and methods of forming the same are presented. The ESD protection devices may be symmetrical to support dual-polarity bias, i.e., the ESD protection devices may provide bi-directional current protection against positive and negative power surges.

The ESD protection device may include two terminal regions to electrically couple the ESD protection device to an electrical system. For an exemplary embodiment of a PNP-type ESD protection device, an N-type doped region may be arranged in each terminal region to reduce the on-resistance of the ESD protection device by introducing a deeper current path to achieve a snapback behavior. The lower on-resistance advantageously enables the ESD protection device to achieve enhanced current performance which aids to reduce the overall footprint of the device.

The terms "upper", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. An electrostatic discharge (ESD) protection device, comprising:
   a substrate including dopants having a first dopant conductivity;
   an active region arranged over the substrate, the active region having an upper surface;
   a first terminal region arranged in the active region; and
   a second terminal region arranged in the active region laterally spaced apart from the first terminal region, wherein the first terminal region and the second terminal region each comprising:
      a well region including dopants having the first dopant conductivity;
      a first doped region arranged in the well region and the first doped region includes dopants having a second dopant conductivity; and
      a doped contact region within the well region and partially in contact with the first doped region, the doped contact region includes dopants having the first dopant conductivity.

2. The ESD protection device of claim 1, wherein the well region has a first depth from the upper surface of the active region and the first doped region has a second depth from the upper surface of the active region, the first depth is deeper than the second depth.

3. The ESD protection device of claim 1, wherein the well region has a first side surface and a second side surface laterally opposite the first side surface, and the first doped region is arranged in the well region laterally spaced apart from the first side surface and the second side surface of the well region.

4. The ESD protection device of claim 1, wherein the first doped region has a side surface, and the side surface of the first doped region is arranged under and contacting the doped contact region.

5. The ESD protection device of claim 4, wherein the doped contact region is spaced apart from the first doped region.

6. The ESD protection device of claim 1, wherein the first terminal region and the second terminal region each further comprising a second doped region, and the respective second doped regions of the first terminal region and the second terminal region are at least partially arranged in the respective well regions and contacting the respective first doped regions of the first terminal region and the second terminal region.

7. The ESD protection device of claim 6, wherein the first doped region has a width and the second doped region has a width, the width of the second doped region is wider than the width of the first doped region.

8. The ESD protection device of claim 6, wherein the second doped region includes dopants having the first dopant conductivity.

9. The ESD protection device of claim 1, wherein the substrate has a first dopant concentration and the well region has a second dopant concentration, the second dopant concentration is lower than the first dopant concentration.

10. The ESD protection device of claim 1, wherein the doped contact region is spaced apart from the well region.

11. An electrostatic discharge (ESD) protection device, comprising:
   a substrate including dopants having a first dopant conductivity;
   an active region arranged over the substrate;
   a deep well region in the active region, the deep well region includes dopants having a second dopant conductivity;
   an insulating layer over the deep well region;
   a first terminal region arranged in the deep well region; and
   a second terminal region arranged in the deep well region laterally spaced apart from the first terminal region, wherein the first terminal region and the second terminal region each comprising:
      a well region including dopants having the first dopant conductivity;

a first doped region arranged in the well region and the first doped region includes dopants having the second dopant conductivity; and a doped contact region within and spaced apart from the well region, wherein the doped contact region is partially in contact with the first doped region.

12. The ESD protection device of claim 11, wherein the insulating layer is a shallow trench isolation layer.

13. The ESD protection device of claim 12, wherein the shallow trench isolation layer is at least partially arranged in the first terminal region and the second terminal region.

14. The ESD protection device of claim 11, wherein the insulating layer is a silicide alignment block layer.

15. A method of forming an ESD protection device, comprising:

forming an active region having an upper surface over a substrate; the substrate including dopants having a first dopant conductivity;

forming a pair of well regions in the active region, each well region including dopants having the first dopant conductivity;

forming a first doped region in each well region of the pair of well regions, the first doped region including dopants having a second dopant conductivity, wherein one well region of the pair of well regions and the respective first doped region in the well region form a first terminal region and the other well region of the pair of well regions and the respective first doped region in the well region form a second terminal region; and forming a doped contact region in each well region of the pair of well regions, the doped contact region is partially in contact with the first doped region and includes dopants having the first dopant conductivity.

16. The method of claim 15, wherein forming the pair of well regions comprises doping the active region with dopants to a dopant concentration higher than a dopant concentration of the substrate.

17. The method of claim 15, wherein forming the pair of well regions comprises doping the active region to a first depth from the upper surface of the active region and forming the first doped region in each well region comprises doping the active region to a second depth from the upper surface of the active region, and the second depth is shallower than the first depth.

18. The method of claim 15, wherein forming the first doped region in each well region of the pair of well regions comprises counter doping the pair of well regions with dopants having the second dopant conductivity.

19. The method of claim 15, further comprises forming a second doped region in each well region of the pair of well regions, the second doped region is formed adjacent to the first doped region in the well region.

20. The method of claim 19, wherein forming the second doped region in each well region of the pair of well regions comprises doping the pair of well regions with dopants to a higher dopant concentration than a dopant concentration of the pair of well regions.

* * * * *